United States Patent
Albertson et al.

(10) Patent No.: US 12,477,681 B2
(45) Date of Patent: Nov. 18, 2025

(54) DAMPER FOR AN ELECTRONIC EQUIPMENT RACK

(71) Applicant: International Business Machines Corporation, Armonk, NY (US)

(72) Inventors: Chad Albertson, Rochester, MN (US); Eric J. Campbell, Rochester, MN (US); Nicholas Ollerich, Rochester, MN (US); Kevin O'Connell, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 17/821,279

(22) Filed: Aug. 22, 2022

(65) Prior Publication Data
US 2024/0064926 A1 Feb. 22, 2024

(51) Int. Cl.
*H05K 7/14* (2006.01)
*H05K 7/18* (2006.01)

(52) U.S. Cl.
CPC ............ *H05K 7/18* (2013.01); *H05K 7/1492* (2013.01)

(58) Field of Classification Search
CPC .............................. H05K 7/18; H05K 7/1492
See application file for complete search history.

(56) References Cited

U.S. PATENT DOCUMENTS

| | | | |
|---|---|---|---|
| 7,249,442 B2 * | 7/2007 | Pellegrino | A47F 5/0018 248/564 |
| 7,464,109 B2 * | 12/2008 | Modi | G06Q 50/30 |
| 7,556,271 B2 | 7/2009 | Robbins et al. | |
| 7,611,157 B2 | 11/2009 | Robbins et al. | |
| 7,628,409 B2 | 12/2009 | Robbins et al. | |
| 8,335,080 B2 * | 12/2012 | Huang | H05K 7/183 312/333 |
| 8,967,392 B1 * | 3/2015 | Czamara | H05K 7/1488 248/638 |
| 9,485,885 B2 | 11/2016 | Czamara et al. | |

(Continued)

FOREIGN PATENT DOCUMENTS

| | | | |
|---|---|---|---|
| CN | 204009711 U | 12/2014 | |
| CN | 211047636 U | 7/2020 | |

(Continued)

OTHER PUBLICATIONS

Tesolution, "Principle of Tuned Mass Damper (TMD) Technology—Pendulum type," https://www.youtube.com/watch?v=GzMuF-LMGaM, Aug. 30, 2016, printed May 31, 2022, 3 pgs.

(Continued)

*Primary Examiner* — Jerry Wu
*Assistant Examiner* — Hung Q Dang
(74) *Attorney, Agent, or Firm* — Aaron N. Pontikos (57) ABSTRACT

Provided is a damper system for an electronic equipment rack. The damper system may include an electronic equipment rack, a battery back-up unit, and a plurality of rails disposed within the electronic equipment rack. The battery back-up unit is slidably secured to the plurality of rails and tuned to dampen seismic oscillations of the electronic equipment rack during an earthquake. The battery back-up unit is also able to provide power to the electronic equipment disposed in the rack during a power outage.

15 Claims, 5 Drawing Sheets

(56) References Cited

U.S. PATENT DOCUMENTS

| | | | |
|---|---|---|---|
| 9,986,658 B2* | 5/2018 | Sarti | H05K 7/1492 |
| 10,624,230 B2 | 4/2020 | Chen et al. | |
| 10,774,558 B2 | 9/2020 | Martin Hernandez | |
| 11,313,434 B2* | 4/2022 | Schubert | F16F 1/36 |
| 11,549,564 B2* | 1/2023 | Geiss | H05K 7/18 |
| 11,737,233 B2* | 8/2023 | Gao | H05K 7/20272 |
| | | | 361/679.02 |
| 2002/0162808 A1 | 11/2002 | Jordan | |
| 2007/0119794 A1* | 5/2007 | Hidaka | F16F 7/104 |
| | | | 211/26 |

FOREIGN PATENT DOCUMENTS

| | | | |
|---|---|---|---|
| JP | 2019096296 A | 6/2019 | |
| KR | 102050497 B1 | 11/2019 | |
| WO | 2013021738 A1 | 2/2013 | |

OTHER PUBLICATIONS

International Search Report and Written Opinion dated Nov. 10, 2023 from International Application No. PCT/EP2023/070813 filed Jul. 27, 2023.

* cited by examiner

DAMPER FOR AN ELECTRONIC EQUIPMENT RACK

BACKGROUND

The present disclosure relates generally to the field of electronic equipment racks, and more particularly to a damper system for an electronic equipment rack.

Electronic equipment racks are a type of physical structure that is used to house various electronic devices. The electronic equipment rack is usually made of a durable material (e.g., metal, composite material, and the like) and may be anchored to the floor to provide stability to the rack. Typically, the electronic equipment rack houses the electronic devices in a vertical configuration. For example, a server rack will house various switches, routers, servers, cables, etc., in a vertical configuration within rectangular drawers or bays of the server rack. In this way, the server rack allows numerous amounts of equipment to be stored in a small physical footprint. However, due to the rigidity of the physical structure of the electronic equipment rack, it may be prone to structural failure in the event on an earthquake.

SUMMARY

Embodiments of the present disclosure include a damper system for an electronic equipment rack. The damper system may include an electronic equipment rack, a battery back-up unit, and a plurality of rails disposed within the electronic equipment rack. The battery back-up unit is slidably secured to the plurality of rails and tuned to dampen seismic oscillations of the electronic equipment rack during an earthquake. This is more advantageous over standard electronic equipment racks, because the damper system prevents structural failure of the rack and/or damage to electronic devices within the rack by minimizing oscillations during an earthquake. Further, the battery back-up unit can provide power to one or more electronic devices disposed in the electronic equipment rack in the event of a loss of power resulting from the earthquake.

In some embodiments, the battery back-up unit may supply power to the one or more electronic devices directly via the plurality of rails. This is advantageous over standard wired connections of electronic equipment which may become loose or disengaged due to the oscillations during an earthquake.

In some embodiments, the plurality of rails may be disposed within a removably secured drawer within the electronic equipment rack where power may be supplied to the battery back-up unit through a connection between a power rail of the electronic equipment rack and a wheel of a drawer to recharge the battery back-up unit. This allows the battery-back up unit to maintain a full charge prior to an earthquake and further obviates the use of wires which may become loose or disengaged.

Additional embodiments of the present disclosure include a damper system for a server rack. The damper system comprising a server rack including a server, a battery back-up unit electrically coupled to the server, and a plurality of rails disposed within the server rack. The battery back-up unit is slidably secured to the plurality of rails and tuned to dampen seismic oscillations of the server rack during an earthquake.

Further embodiments of the present disclosure include a method for damping oscillations of an electronic equipment rack during an earthquake. The method comprises, in response to seismic oscillation of the electronic equipment rack caused by an earthquake, damping the seismic oscillations using a damper system for the electronic equipment rack. In some embodiments, the method further comprises, in response to a loss of power to one or more electronic devices disposed in the electronic equipment rack, supplying, by the battery back-up unit of the damper system, power to the one or more electronic devices disposed in the electronic equipment rack. Once power is restored, the method further comprises recharging the battery back-up unit of the damper system via a direct connection.

The above summary is not intended to describe each illustrated embodiment or every implementation of the present disclosure.

BRIEF DESCRIPTION OF THE DRAWINGS

The drawings included in the present disclosure are incorporated into, and form part of, the specification. They illustrate embodiments of the present disclosure and, along with the description, serve to explain the principles of the disclosure. The drawings are only illustrative of typical embodiments and do not limit the disclosure.

While the embodiments described herein are amenable to various modifications and alternative forms, specifics thereof have been shown by way of example in the drawings and will be described in detail. It should be understood, however, that the particular embodiments described are not to be taken in a limiting sense. On the contrary, the intention is to cover all modifications, equivalents, and alternatives falling within the spirit and scope of the disclosure.

DETAILED DESCRIPTION

Aspects of the present disclosure relate generally to the field of electronic equipment racks, and more particularly to a damper for an electronic equipment rack. While the present disclosure is not necessarily limited to such applications, various aspects of the disclosure may be appreciated through a discussion of various examples using this context.

Electronic equipment racks are a type of physical structure that is used to house various electronic devices. The electronic equipment rack is usually made of a durable material (e.g., metal, composite material, and the like) and may be anchored to the floor to provide stability to the rack. Typically, the electronic equipment rack houses the electronic devices in a vertical configuration. For example, a server rack will house various switches, routers, servers, cables, etc., in a vertical configuration within rectangular drawers or bays of the server rack. In this way, the server rack allows numerous amounts of equipment to be stored in a small physical footprint.

However, due to the rigidity of the physical structure of the electronic equipment rack, it may be prone to structural failure in the event on an earthquake. For example, the movement of the ground during an earthquake may produce seismic oscillations that resonate and may cause the electronic equipment rack to move or sway. The greater the amplitude of the vibrations/oscillations the more likely the electronic equipment rack will suffer structural damage, tip, or even collapse. To overcome tipping, some electronic equipment racks may be anchored to the floor, but this approach still leaves the rack susceptible to structural damage if seismic oscillations are significant. Further, electronic equipment or devices disposed within the rack may be damaged due to intense movement of the rack resulting from the oscillations.

Embodiments of the present disclosure are directed to a new type of electronic equipment rack that includes a damper. In particular, some embodiments of the present disclosure comprise a damper system including an electronic equipment rack, a battery back-up unit, and a plurality of rails disposed with the electronic equipment rack, where the battery back-up unit is slidably secured to the plurality of rails and tuned to dampen seismic oscillations of the electronic equipment rack during an earthquake or other ground shaking event (e.g., weather related, human generated, etc.). In some embodiments, the plurality of rails may comprise a set of multi-axis rails that allow the battery back-up unit to slide in an x-y plane in order to dampen the oscillations. Unlike conventional electronic equipment racks, the damper system prevents structural damage to the rack by dissipating energy placed on the structure that is produced by the earthquake. Further, the battery back-up unit is also configured to supply power to electrical devices/components stored within the electronic equipment rack in event of a power failure. In some embodiments, the power may be supplied directly through the rails of the damper system. This is more advantageous than traditional wired connections which may become loose or disengaged due to the oscillations during an earthquake.

It is to be understood that the aforementioned advantages are example advantages and should not be construed as limiting. Embodiments of the present disclosure can contain all, some, or none of the aforementioned advantages while remaining within the spirit and scope of the present disclosure.

Figure 1:
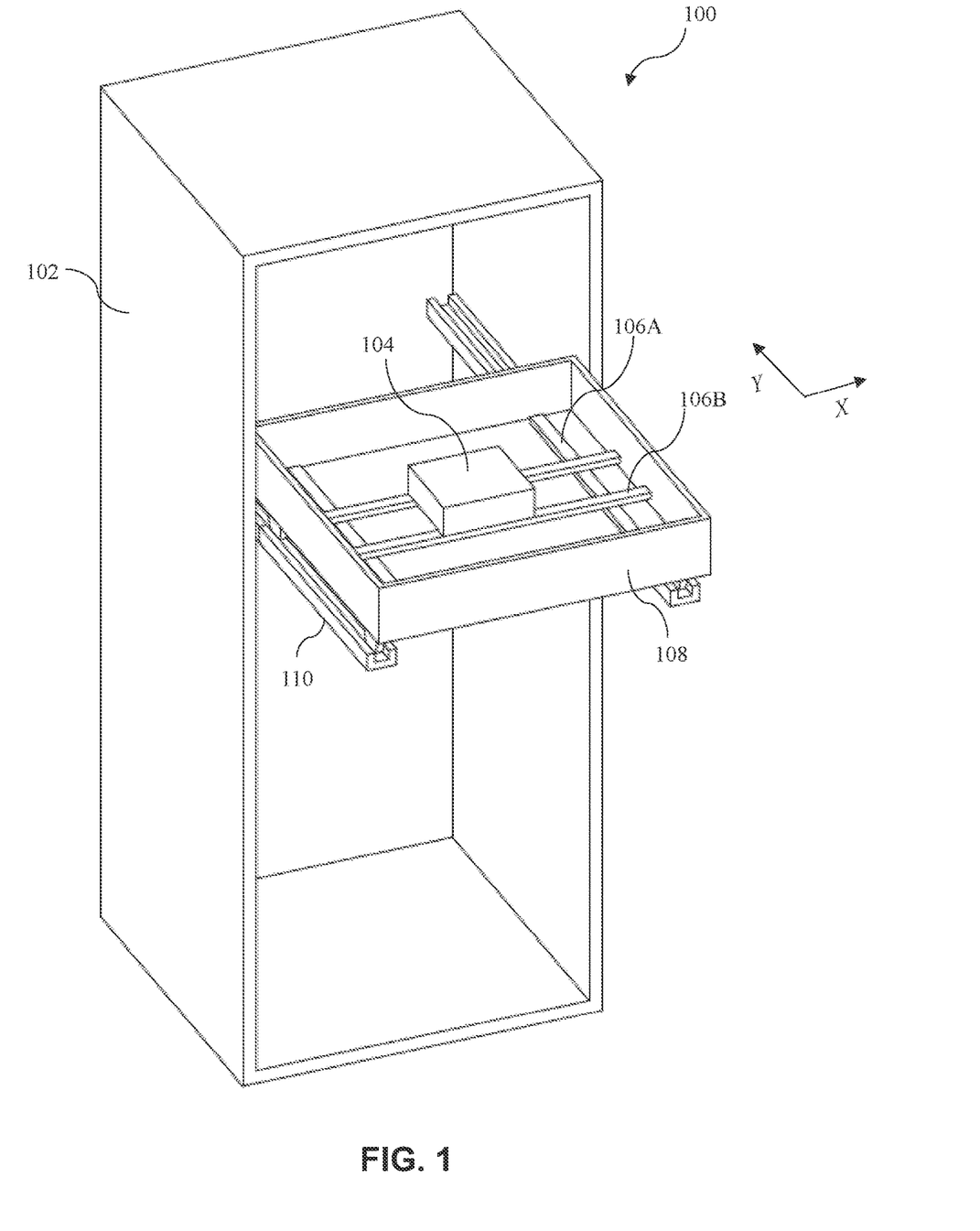
FIG. 1 illustrates a front perspective view of a damper system for an electronic equipment rack, in accordance with embodiments of the present disclosure.

Referring now to FIG. 1, shown is a front perspective view of a damper system 100 for an electronic equipment rack 102, in accordance with embodiments of the present disclosure. The damper system 100 includes the electronic equipment rack 102, a battery back-up unit 104, and a plurality of rails 106 that are disposed within the electronic equipment rack 102. In some embodiments, the electronic equipment rack 102 may be configured as a server rack that houses one or more servers and/or additional electronic devices (e.g., routers, switches, networking equipment, etc.). The battery back-up unit 104 is slidably secured to the plurality of rails 106 and tuned to dampen seismic oscillations of the electronic equipment rack 102 during an earthquake or any other type of oscillation generating event (e.g., weather related events, human caused events, etc.). In embodiments, the battery back-up unit 104 may be mass tuned using one or more damping mechanism (not shown) that are configured to aide in damping seismic oscillation. The damping mechanism may be any type of damping device (e.g., springs, hydraulics, fluid, rubber, foam, friction product, etc.) that can produce a damping effect. This is more advantageous over standard electronic equipment racks, because the damper system 100 prevents structural failure of the rack and/or damage to any electronic devices stored within the rack by minimizing oscillations during an earthquake. Further, the battery back-up unit can provide power to one or more electronic devices disposed in the electronic equipment rack in the event of a loss of power resulting from the earthquake.

In embodiments, the battery back-up unit 104 may include one or more fasteners (not shown) that secure the battery back-up unit to the plurality of rails 106. The fasteners can be any type of fastener, such as screws, bolts, magnetic fasteners, clips, and the like. In embodiments, the battery back-up unit 104 includes a sliding mechanism that allows the battery back-up unit to slide along the plurality of rails 106. For example, the sliding mechanism may comprise sliding rails, rollers, wheels, ball bearings, and the like, and is not meant to be limiting.

In the illustrated embodiment, the battery back-up unit 104 is shown as a cube, however, this is not meant to be limiting. It is noted that the size, shape, dimensions, weight, etc., of the battery back-up unit 104 may change. Further, the plurality of rails 106 are shown as having a first set of rails 106A positioned along a y-axis and a second set of rails 106B disposed perpendicular on top of the first set of rails 106B positioned along an x-axis. It is noted that various configuration of the plurality of rails 106 may change. For example, less or more rails may be included in the configuration of the plurality of rails 106. In some embodiments, the rails may include various shapes and/or attributes. For example, a rail may be curved and/or include damping mechanisms that are not shown but are within the scope of the present disclosure.

In the illustrated embodiment, the plurality of rails 106 are disposed within a removably secure drawer 108, which can be removed and/or secured to the electronic equipment rack 102 via rails 110. However, in some embodiments, the plurality of rails 106 may be disposed within the electronic equipment rack 102 without the need of the drawer 108. For example, the plurality of rails 106 may be permanently secured to the electronic equipment rack 102. In some embodiments, drawer 108 may include a plurality of wheels (not shown) that allow the drawer to be removed from the electronic equipment rack 102.

Figure 2A:
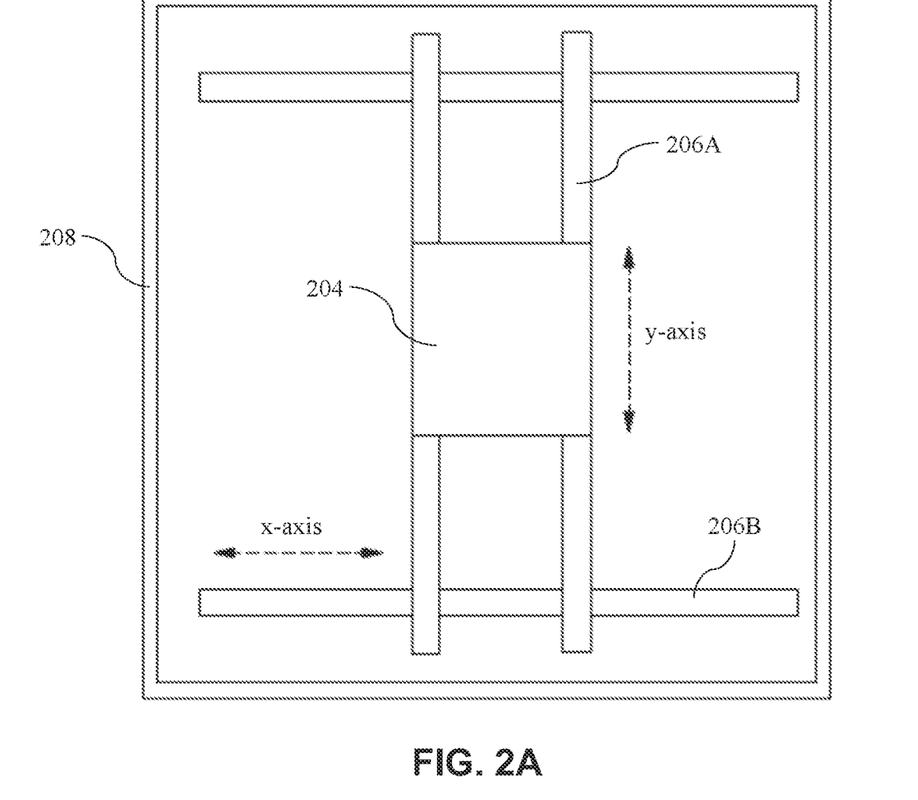
FIG. 2A illustrates a top view of a drawer of a damper system, in accordance with embodiments of the present disclosure.
Figure 2B:
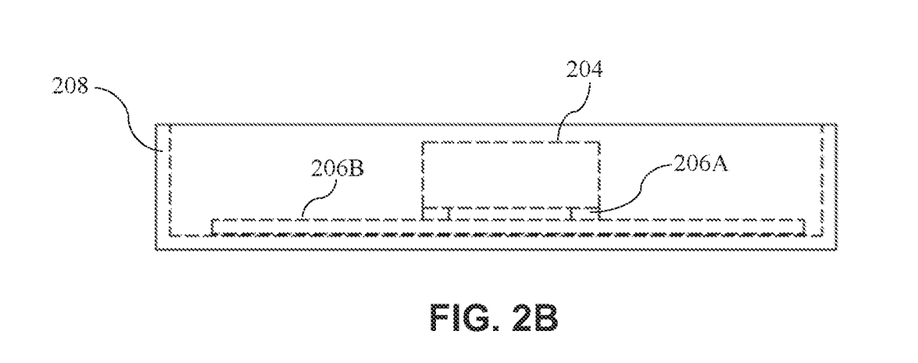
FIG. 2B illustrates a side view of the drawer of a damper system, in accordance with embodiments of the present disclosure.

Referring now to FIG. 2A and FIG. 2B, shown is a top view of a drawer 208 of a damper system and a side view of the drawer 208 of the damper system, respectively, in accordance with embodiments of the present disclosure. The drawer 208 may be substantially similar to drawer 108 of damper system 100 of FIG. 1. The drawer 208 may be configured to be removably secured within an electronic equipment rack, such as electronic equipment rack 102 of FIG. 1.

In the illustrative embodiments, a plurality of rails 206A and 206B, collectively referred to as rails 206 are disposed within the drawer 208. In the illustrated embodiment, the plurality of rails 206 comprise a set of multi-axis rails that allow the battery back-up unit 204 to slide in an x-y plane when oscillations of the electronic equipment rack occur. For example, rails 206B allow the battery back-up unit 204 to slide along an x-axis, while rails 206A allow the battery back-up unit 104 to slide along a y-axis. As shown, rails 206A are positioned on top of rails 206B. In the illustrated embodiments, rails 206A are configured to slide along rails 206B. In some embodiments, rails 206A include a sliding mechanism that allows the rail to slide along rail 206B in response to seismic oscillation. In some embodiments, the rail configuration may be different as long as the sliding function is maintained. For example, rails 206B may be positioned on rails 206A or in another example the rails may be interconnected such that they move and are disposed in the same plane.

In some embodiments, the battery back-up unit 204 may include one or more damping mechanism (not shown) that are configured to aide in damping seismic oscillation. The damping mechanism may be any type of damping device (e.g., springs, hydraulics, fluid, rubber, foam, friction product, etc.) that can produce a damping effect. For example, the battery back-up unit 204 may include a plurality of damped springs that are attached to each side of the battery back-up unit 204 and/or rails 206 to dampen seismic oscillations. For example, one or more damped springs may be attached to each side of the battery back-up unit 204 to keep it positioned within the center of the rack during an earthquake. The damped springs may be mass tuned to an oscillation frequency that best prevents structural failure of the electronic equipment rack. The oscillation frequency may be based on a given amplitude or range of amplitudes of potential earthquakes (e.g., based on Richter scale measurements) that would most likely cause structural failure of the electronic equipment rack.

In some embodiments, the plurality of rails 206 may be configured to directly supply power from the battery back-up unit 204 to one or more electronic devices stored within the electronic rack. For example, the plurality of rails 206 may be constructed of an electrically conductive material (e.g., a metal) such that power can be sent from the battery back-up unit 204, through the plurality of rails 206 and drawer 208 to another electrical device within the rack. In some embodiments, the battery back-up unit 204 may include wired connections or cables to electronic devices within the rack. For example, the battery back-up may be electrically coupled to a server within a server rack. In some embodiments, the battery back-up unit 204 is recharged via a wireless connection as described below.

Figure 3:
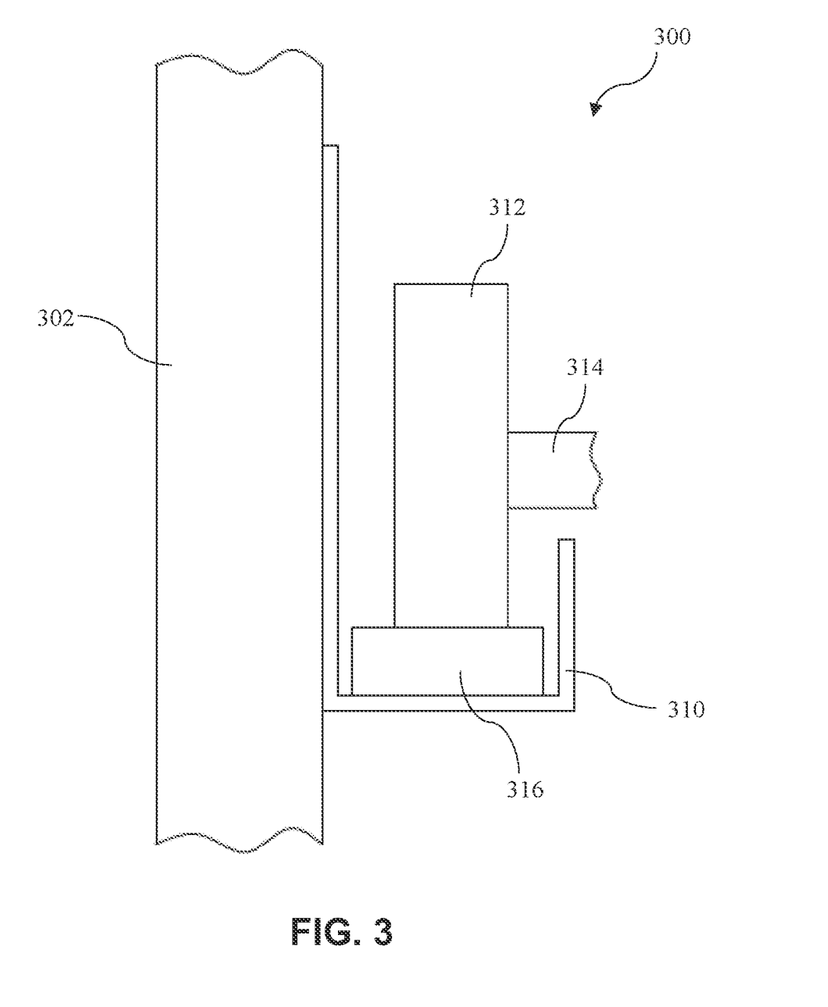
FIG. 3 illustrates a front view of a wheel of a drawer of a damper system in connection with a power rail of an electronic equipment rack, in accordance with embodiments of the present disclosure.

Referring now to FIG. 3, shown is a front zoomed view of a wheel 312 of the drawer of the damper system 300 in connection with a power rail 316 of the electronic equipment rack 302, in accordance with embodiments of the present disclosure. In the illustrated embodiment, rail 310 is secured to a sidewall of electronic equipment rack 302. Rail 310 includes the power rail 316 which is configured to supply power to recharge the battery back-up unit (not shown) via the wheel 312 of the drawer. As shown, power may be supplied from the power rail 316 to the wheel 312 and through an axle 314 of the drawer. The axle 314 may connect/contact the plurality of rails where the battery back-up unit is secured within the drawer as shown in FIG. 1, FIG. 2A, and FIG. 2B. In embodiments, the wheel 312, axle 314, power rail 316, and rail 310 may be constructed from electrically conductive materials (e.g., various metals). In this way, the battery-back up unit may maintain a full charge prior to an earthquake and obviates the use of wires which may become loose or disengaged.

Figure 4A:
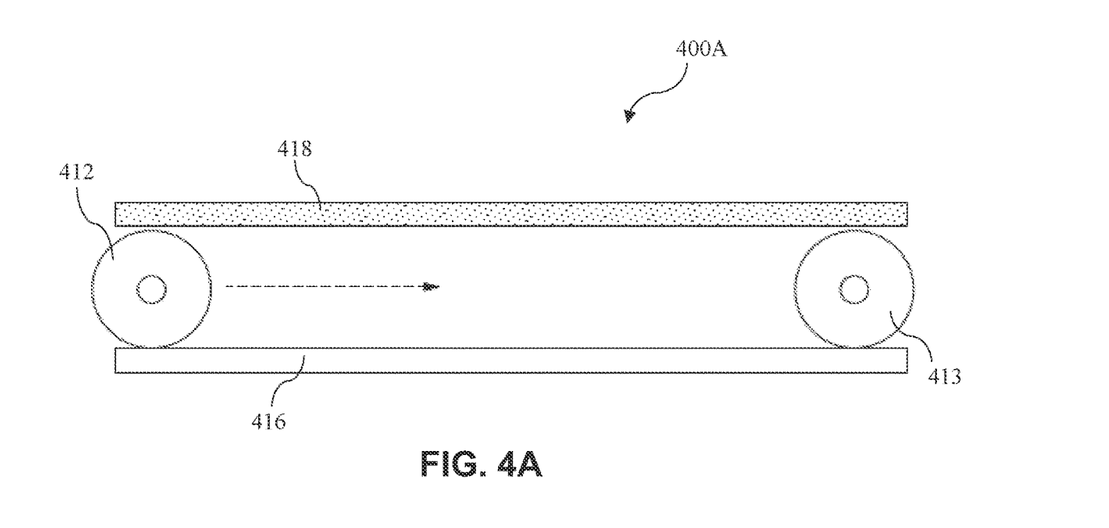
FIG. 4A illustrates a side view of a wheel of a drawer of a damper system in connection with a power rail of an electronic equipment rack, in accordance with embodiments of the present disclosure.

Referring now to FIG. 4A, shown is a side view of a wheel 412 of the drawer of the damper system 400A in connection with a power rail 416 of an electronic equipment rack, in accordance with embodiments of the present disclosure. In the illustrated embodiment, the wheel 412 is secured to the drawer 418 and configured to contact power rail 416 when placed in the electronic equipment rack. Wheel 413 is secured to the sidewall or rail of the equipment rack and remains stationary when the drawer 418 is removed. As shown, wheel 412 may slide along the power rail 416 toward wheel 413 when accessing and/or removing the drawer 418 that holds the battery back-up unit.

Figure 4B:
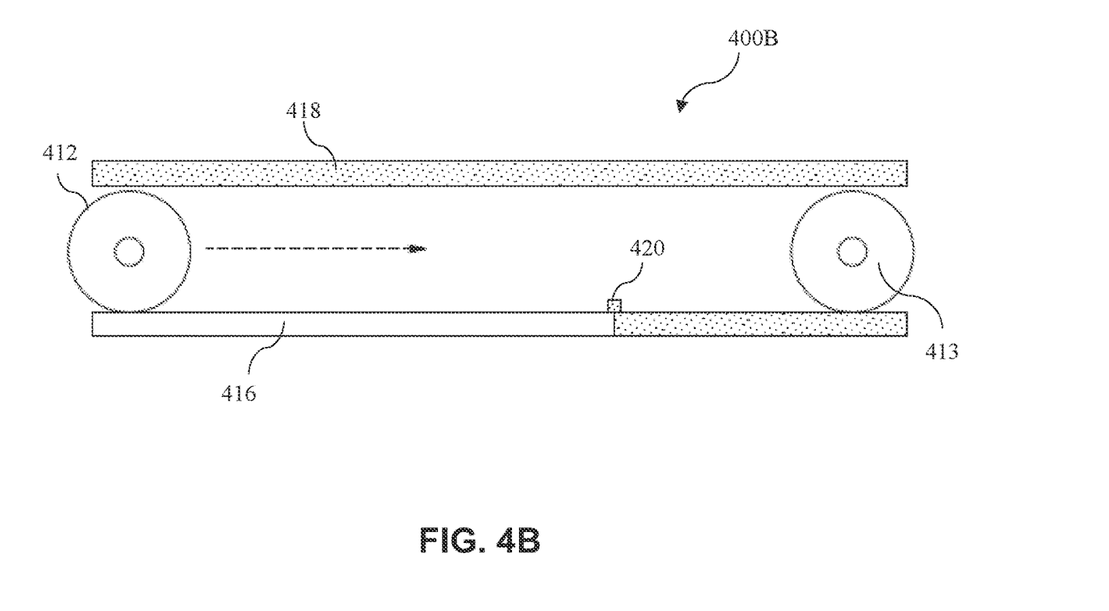
FIG. 4B illustrates a side view of a wheel of a drawer of a damper system in connection with a power rail having a safety disconnect, in accordance with embodiments of the present disclosure.

Referring now to FIG. 4B, shown is a side view of the wheel 412 of the drawer of the damper system in connection with the power rail 416 with a safety disconnect 420, in accordance with embodiments of the present disclosure. In the illustrated embodiment, the wheel 412 is secured to the drawer 418 and configured to contact power rail 416 when placed in the electronic equipment rack. Wheel 413 is secured to the sidewall or rail of the equipment rack and remains stationary when the drawer 418 is removed. As shown, wheel 412 may slide along the power rail 416 toward wheel 413 when accessing and/or removing the drawer 418 that holds the battery back-up unit. In the illustrated embodiments, the power rail 416 includes a safety disconnect that prevents a user from touching a live electrical connection when removing the drawer. The safety disconnect 420 is shown as a protrusion disposed along the power rail 416. However, this example is not meant to be limiting. The safety disconnect can be in any type of configuration that prevents a user from touching the power rail 416. In this way, the drawer 418 can be safely removed from the rack without risking touching the live power rail 416.

Figure 5:
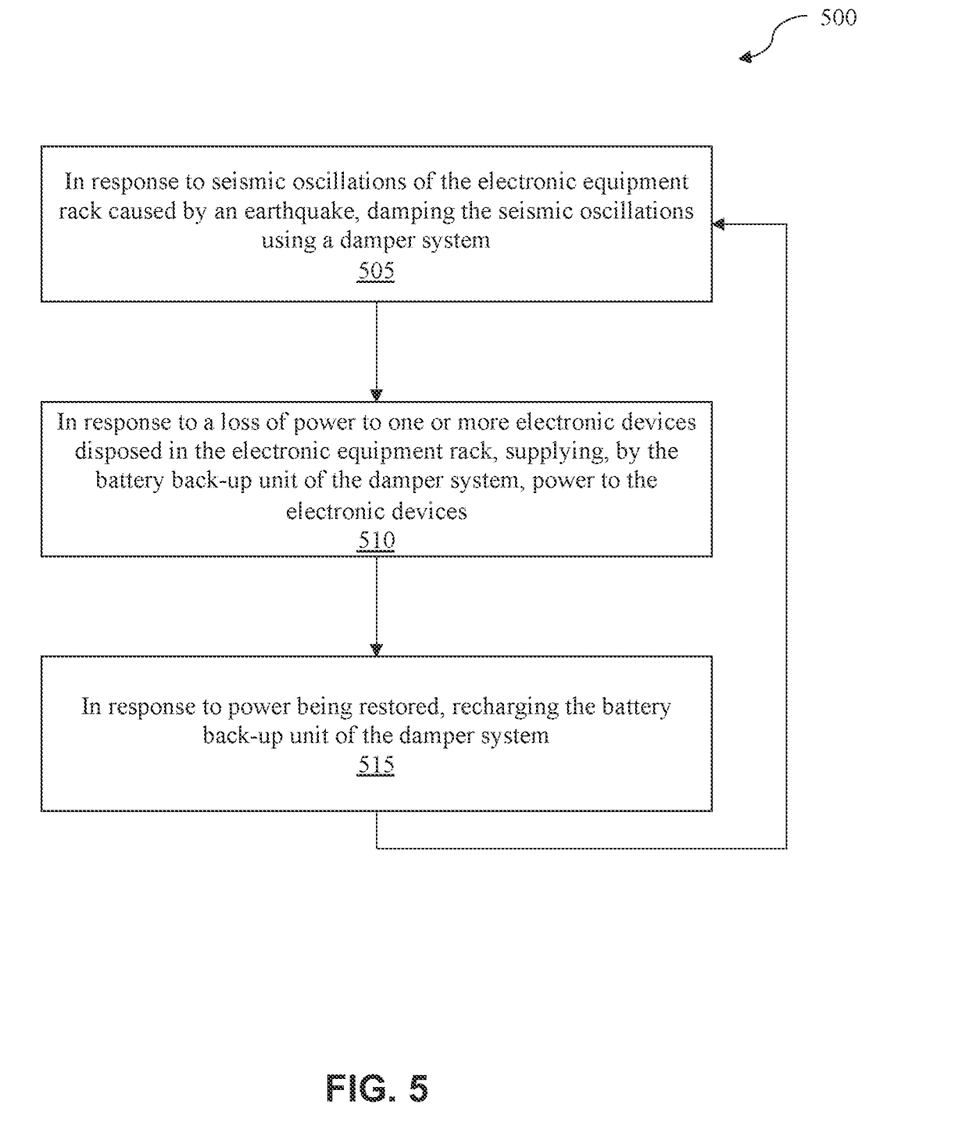
FIG. 5 illustrates a flow diagram of an example method for damping seismic oscillations of the electronic equipment rack using a damper system, in accordance with embodiments of the present disclosure.

Referring now to FIG. 5, shown is a flow diagram of an example method 500 for damping seismic oscillations of the electronic equipment rack using a damper system, in accordance with embodiments of the present disclosure. The method 500 utilizes the damper system 100 as described in FIG. 1.

In embodiments, the method 500 begins, in response to seismic oscillations of the electronic equipment rack caused by an earthquake, by damping the seismic oscillations using the damper system for the electronic equipment rack. This is illustrated at step 505. For example, in the event of an earthquake, the damper system will prevent failure of the structural components of the electronic equipment rack by damping the oscillations using the mass tuned battery back-up unit. This is more advantageous over standard electronic equipment racks, because the damper system prevents structural failure of the rack and/or damage to electronic devices within the rack by minimizing oscillations during an earthquake.

In some embodiments, the method 500 continues, in response to a loss of power to one or more electronic devices disposed in the electronic equipment rack, by supplying power to the one or more electronic devices disposed in the electronic equipment rack. This is illustrated at step 510. For example, general power supplied to the electronic equipment rack may be lost due to the severity of the earthquake. Therefore, the battery back-up unit not only acts as a damper but is also configured to supply battery back-up power the electronic devices of the rack. For example, the battery back-up unit may supply back-up power to a server that is disposed in the rack. In some embodiments, the battery back-up unit directly supplies power to the electronic devices via a series of power rails. For example, the battery back-up power may be sent through the plurality of rails that support the battery back-up unit through one or more rails of the electronic equipment rack and to the electronic devices. In some embodiments, the back back-up unit may include electrical cables and/or busbars that supply battery back-up power directly to the electronic devices.

In embodiments, the battery back-up unit may include circuitry (e.g., sensors, switches, etc.) that is configured to sense when power is being supplied by the power rail of the electronic equipment rack or if a loss of power has occurred. The circuitry may include a switching mechanism that when the loss of power has been detected/sensed, the battery back-up unit will switch on and begin supplying back-up power to the electronic devices of the electronic equipment rack. The battery back-up unit's circuitry is also configured to detect when the power has returned to the power rail of the electronic equipment rack. In response to the power returning to the rack, the battery back-up will switch off/cease supplying battery back-up power to the rack.

In some embodiments, the method 500 continues, in response to power being restored to the electronic equipment rack, by recharging the battery back-up unit of the damper system. This is illustrated at step 515. In some embodiments, the battery back-up unit is recharged via the direct connection between the battery back-up unit and the electronic equipment rack as discussed above. This allows the battery-back up unit to maintain a full charge prior to an earthquake and further obviates the use of wires which may become loose or disengaged.

In embodiments, the battery back-up unit's circuitry may include sensors/switches that detect and/or measure the percent battery charge of the battery back-up unit and initiate or terminate charging functions based on the percent battery charge. For example, once the battery back-up unit is determined to be fully charged, the switches will terminate the charging functions. In some embodiments, the method 500 returns to step 505 in the event of another earthquake occurring.

The terminology used herein is for the purpose of describing particular embodiments only and is not intended to be limiting of the various embodiments. As used herein, the singular forms "a," "an," and "the" are intended to include the plural forms as well, unless the context clearly indicates otherwise. It will be further understood that the terms "includes" and/or "including," when used in this specification, specify the presence of the stated features, integers, steps, operations, elements, and/or components, but do not preclude the presence or addition of one or more other features, integers, steps, operations, elements, components, and/or groups thereof. In the previous detailed description of example embodiments of the various embodiments, reference was made to the accompanying drawings (where like numbers represent like elements), which form a part hereof, and in which is shown by way of illustration specific example embodiments in which the various embodiments may be practiced. These embodiments were described in sufficient detail to enable those skilled in the art to practice the embodiments, but other embodiments may be used and logical, mechanical, electrical, and other changes may be made without departing from the scope of the various embodiments. In the previous description, numerous specific details were set forth to provide a thorough understanding of the various embodiments. But, the various embodiments may be practiced without these specific details. In other instances, well-known circuits, structures, and techniques have not been shown in detail in order not to obscure embodiments.

Different instances of the word "embodiment" as used within this specification do not necessarily refer to the same embodiment, but they may. Any data and data structures illustrated or described herein are examples only, and in other embodiments, different amounts of data, types of data, fields, numbers and types of fields, field names, numbers and types of rows, records, entries, or organizations of data may be used. In addition, any data may be combined with logic, so that a separate data structure may not be necessary. The previous detailed description is, therefore, not to be taken in a limiting sense.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

Although the present disclosure has been described in terms of specific embodiments, it is anticipated that alterations and modification thereof will become apparent to those skilled in the art. Therefore, it is intended that the following claims be interpreted as covering all such alterations and modifications as fall within the true spirit and scope of the disclosure.

What is claimed is:

1. A damper system for an electronic equipment rack comprising:
    an electronic equipment rack;
    a battery back-up unit; and
    a plurality of rails disposed in a removably secured drawer within the electronic equipment rack, wherein the battery back-up unit is slidably secured to the plurality of rails and tuned to dampen seismic oscillations of the electronic equipment rack,
    wherein a first rail of the electronic equipment rack includes a safety disconnect configured to deactivate the power supply to the drawer when the drawer is removed from the electronic equipment rack.

2. The damper system of claim 1, wherein the plurality of rails comprises a set of multi-axis rails that allow the battery back-up unit to slide in an x-y plane.

3. The damper system of claim 1, wherein the battery back-up unit supplies power to one or more electronic devices disposed in the electronic equipment rack in response to a loss of power.

4. The damper system of claim 3, wherein the battery back-up unit supplies power to the one or more electronic devices directly via the plurality of rails disposed in the removably secured drawer within the electronic equipment rack.

5. The damper system of claim 1, wherein power is supplied to the battery back-up unit through a connection between a first rail of the electronic equipment rack and a wheel of the drawer to recharge the battery back-up unit.

6. A damper system for a server rack comprising:
    an electronic equipment rack;
    a battery back-up unit; and
    a plurality of rails disposed in a removably secured drawer within the electronic equipment rack, wherein the battery back-up unit is slidably secured to the plurality of rails and tuned to dampen seismic oscillations of the electronic equipment rack,
wherein power is supplied to the battery back-up unit through a connection between a first rail of the electronic equipment rack and a wheel of the drawer to recharge the battery back-up unit.

7. The damper system of claim 6, wherein the plurality of rails comprises a set of multi-axis rails that allow the battery back-up unit to slide in an x-y plane.

8. The damper system of claim 6, wherein the battery back-up unit supplies power to one or more electronic devices disposed in the electronic equipment rack in response to a loss of power.

9. The damper system of claim 8, wherein the battery back-up unit supplies power to the one or more electronic devices directly via the plurality of rails disposed in the removably secured drawer within the electronic equipment rack.

10. The damper system of claim 6, wherein a first rail of the electronic equipment rack includes a safety disconnect configured to deactivate the power supply to the drawer when the drawer is removed from the electronic equipment rack.

11. A damper system for an electronic equipment rack comprising:
an electronic equipment rack;
a battery back-up unit; and
a plurality of rails disposed in a removably secured drawer within the electronic equipment rack, wherein the plurality of rails comprises a set of multi-axis rails that allow the battery back-up unit to slide in an x-y plane within the drawer,
wherein the battery back-up unit is slidably secured to a first pair of rails of the set of multi-axis rails and tuned to dampen seismic oscillations of the electronic equipment rack.

12. The damper system of claim 11, wherein the battery back-up unit supplies power to one or more electronic devices disposed in the electronic equipment rack in response to a loss of power.

13. The damper system of claim 11, wherein the battery back-up unit supplies power to the one or more electronic devices directly via the plurality of rails.

14. The damper system of claim 13, wherein power is supplied to the battery back-up unit through a connection between a first rail of the electronic equipment rack and a wheel of the drawer to recharge the battery back-up unit.

15. The damper system of claim 11, wherein a first rail of the electronic equipment rack includes a safety disconnect configured to deactivate the power supply to the drawer when the drawer is removed from the electronic equipment rack.

* * * * *